(12) United States Patent
Vasoya

(10) Patent No.: US 10,531,556 B1
(45) Date of Patent: *Jan. 7, 2020

(54) PRINTED CIRCUIT BOARD THAT PROVIDES A DIRECT THERMAL PATH BETWEEN COMPONENTS AND A THERMAL LAYER AND METHOD FOR ASSEMBLY

(71) Applicant: Adura Led Solutions, LLC, Corona, CA (US)

(72) Inventor: Kalu K. Vasoya, Yorba Linda, CA (US)

(73) Assignee: Adura LED Solutions, LLC, Corona, CA (US)

( * ) Notice: Subject to any disclaimer, the term of this patent is extended or adjusted under 35 U.S.C. 154(b) by 59 days.

This patent is subject to a terminal disclaimer.

(21) Appl. No.: 15/882,895

(22) Filed: Jan. 29, 2018

Related U.S. Application Data

(63) Continuation of application No. 14/684,245, filed on Apr. 10, 2015, now Pat. No. 9,883,580.

(Continued)

(51) Int. Cl.
  *F21V 21/00* (2006.01)
  *H05K 1/02* (2006.01)
  (Continued)

(52) U.S. Cl.
  CPC .............. *H05K 1/0207* (2013.01); *F21K 9/90* (2013.01); *H05K 1/111* (2013.01); *H05K 3/301* (2013.01);
  (Continued)

(58) Field of Classification Search
  CPC ...... H05K 1/0207; H05K 6/301; H05K 1/111; H05K 2201/10106; F21K 9/30; F21K 9/90; F21Y 2101/02
  (Continued)

(56) References Cited

U.S. PATENT DOCUMENTS 5,523,919 A   6/1996   Canova
5,857,767 A   1/1999   Hochstein
(Continued)

OTHER PUBLICATIONS

"Email communication from Roy English @ OCIPCB.com to Kris Vasoy regarding technology and process", Jan. 5, 2010, 2 pp. total.
(Continued)

*Primary Examiner* — Laura K Tso
(74) *Attorney, Agent, or Firm* — Womble Bond Dickinson (US) LLP

(57) ABSTRACT

A method of assembling a component to a printed circuit board that includes a thermal layer and a circuit layer separated by a dielectric layer. The circuit layer includes circuit pads that correspond to terminal surfaces on the component. The dielectric layer includes an aperture that exposes a portion of the thermal layer that correspond to a thermal pad on the component. Solder paste is applied to the circuit pads and the exposed thermal layer. Lower surfaces of the solder paste are in contact with the circuit pads and the thermal layer and upper surfaces of the solder paste are substantially coplanar. The component is placed on the solder paste. The printed circuit board and the component are heated to create solder joints between the terminal surfaces on the component and the circuit pads and between the thermal pad on the component and the thermal layer.

16 Claims, 2 Drawing Sheets

Related U.S. Application Data

(60) Provisional application No. 61/978,824, filed on Apr. 11, 2014.

(51) Int. Cl.
   *F21K 9/90*      (2016.01)
   *H05K 3/30*      (2006.01)
   *H05K 1/11*      (2006.01)
   *F21Y 101/00*    (2016.01)

(52) U.S. Cl.
   CPC ............... *F21Y 2101/00* (2013.01); *H05K 2201/10106* (2013.01)

(58) Field of Classification Search
   USPC ............................................ 362/382, 249.02
   See application file for complete search history.

(56) References Cited

U.S. PATENT DOCUMENTS

| | | | |
|---|---|---|---|
| 6,428,189 | B1 | 8/2002 | Hochstein |
| 7,505,275 | B2 | 3/2009 | Reis et al. |
| 7,911,797 | B2 | 3/2011 | Grajcar |
| 8,003,415 | B2 | 8/2011 | Wang et al. |
| 9,445,490 | B2 | 9/2016 | Waegli et al. |
| 9,883,580 | B1 * | 1/2018 | Vasoya ............... H05K 1/0207 |
| 2003/0189830 | A1 | 10/2003 | Sugimoto et al. |
| 2004/0065894 | A1 | 4/2004 | Hashimoto et al. |
| 2009/0116252 | A1 | 5/2009 | Kille et al. |
| 2010/0003788 | A1 | 1/2010 | Wang et al. |
| 2011/0272179 | A1 | 11/2011 | Vasoya |
| 2012/0201028 | A1 | 8/2012 | Sanpei et al. |
| 2013/0271992 | A1 | 10/2013 | Kim et al. |

OTHER PUBLICATIONS

"Final Office Action dated Nov. 14, 2013 for U.S. Appl. No. 13/095,799", dated Nov. 14, 2013.
"Notice of Allowance dated Sep. 27, 2017 for U.S. Appl. No. 14/684,245", dated Sep. 27, 2017.
"Office Action dated Apr. 8, 2013 for U.S. Appl. No. 13/095,799", dated Apr. 8, 2013.
"Office Action dated Jul. 14, 2014 for Canadian Patent Application No. 2,798,289", dated Jul. 14, 2014.
"Office Action dated May 31, 2017 for U.S. Appl. No. 14/684,245", dated May 31, 2017.
"Office Action dated Nov. 17, 2015 for U.S. Appl. No. 13/095,799", dated Nov. 17, 2015.
"Office Action dated Sep. 14, 2015 for Canadian Patent Application No. 2,798,289", dated Sep. 14, 2015.
"PCT/US2011/035063 (Filing Date: May 3, 2011)—Notification of Transmittal of the International Search Report of the Written Opinion of the International Searching Authority, or the Declaration, dated Jan. 11, 2012", dated Jan. 11, 2012.
DSEM Systems Technology, "Selective insulation MCPCB with direct thermal path for LED", www.dsem.com, Malaysia, Apr. 29, 2008, 1 pp. total.
Dubois, Mike "PEC (Printed Electronic Circuit) process for LED interconnection", Article written by Mike DuBois @ Caledon Controls Ltd., Mississauga, On. Canada, undated, 8 pp. total.
Fujipoly DSEM Inc., "Alox Metal Substrate (AMS) Datasheet", 2009, 4 pp. total.
Henkel Electronics, "Using Thermal Clad Dielectric Material . . . ", Downloaded from http://www.bergquistcompany.com/pdfs/selectorGuides/specialtyaps.pdf, undated, pp. 10-11.
Leds Magazine, "Polo Tech introduces new Graphite PCB with better thermal conductivity", www.polo-tech.com.tw, Jan. 20, 2009, 1 pp. total.
Ozark Circuits, "Thermal Management Solutions", Ozark Circuits company brochure, undated, 15 pp. total.
Thermastrate, "Ultratherm brochure", 2009, 1 pp. total.
TT Electronics, IRC Advanced Film Division "Insulated Aluminum Substrates, Thermal Solutions for Hi Brightness LED Applications", Corpus Christi, TX, May 2006, 6 pp. total.
TT Electronics, IRC Advanced Film Division "Thick Film Application Specific Capabilities", Corpus Christi, TX, undated, 6 pp. total.
TT Electronics, IRC Inc. (AFD) "Insulated Aluminum Substrates, Thermal Solutions for Power Applications", Corpus Christi, TX, Sep. 2002, 4 pp. total.

* cited by examiner

PRINTED CIRCUIT BOARD THAT PROVIDES A DIRECT THERMAL PATH BETWEEN COMPONENTS AND A THERMAL LAYER AND METHOD FOR ASSEMBLY

CROSS-REFERENCE TO RELATED APPLICATIONS

This application is a continuation of U.S. patent application Ser. No. 14/684,245 filed Apr. 10, 2015, which claims the benefit of U.S. Provisional Patent Application No. 61/978,824 filed Apr. 11, 2014, the entireties of which are incorporated herein by reference.

BACKGROUND

Field

Embodiments of the invention relate to the field of means for dissipating heat from electronic components; and more specifically, to printed circuit boards including a heat conducting means for cooling devices mounted to the printed circuit board.

Background

High power (HP), high brightness (HB) light-emitting diodes (LEDs) are replacing other technologies such as incandescent and fluorescent bulbs in signaling, solid state lighting, vehicle headlight and other applications due to improved luminescent efficiencies and extended lifetime. Power dissipation ratings ranging from 500 mW to as much as 25 watts in a single package have become a standard and are expected to increase in the future.

Despite their efficiencies, the majority of the power provided to an LED is converted to heat. Heat reduces efficiencies, reduces light output, alters the color temperature of the light, and reduces the long-term reliability of LED devices. Consequently, thermal management of high power LEDs is important for proper operation and extended life.

Modern surface mount high output LED devices include a thermal pad that provides a path with low thermal resistance for dissipating the heat generated within the device. The thermal pad requires a connection to an efficient means of heat transfer away from the LED device.

It would be desirable to provide a method for assembling a printed circuit board that provides a direct thermal path between a component, such as an LED, and a thermal layer printed circuit board to provide an exit path for heat generated by the COMPONENT.

SUMMARY

A method of assembling a component to a printed circuit board that includes a thermal layer and a circuit layer separated by a dielectric layer. The circuit layer includes circuit pads that correspond to terminal surfaces on the COMPONENT. The dielectric layer includes an aperture that exposes a portion of the thermal layer that correspond to a thermal pad on the LED. Solder paste is applied to the circuit pads and the exposed thermal layer. Lower surfaces of the solder paste are in contact with the circuit pads and the thermal layer and upper surfaces of the solder paste are substantially coplanar. The component is placed on the solder paste. The printed circuit board and the component are heated to create solder joints between the terminal surfaces on the component and the circuit pads and between the thermal pad on the component and the thermal layer.

Other features of the present invention will be apparent from the accompanying drawings and from the detailed description that follows below.

BRIEF DESCRIPTION OF THE DRAWINGS

The invention may best be understood by referring to the following description and accompanying drawings that are used to illustrate embodiments of the invention by way of example and not limitation. In the drawings, in which like reference numerals indicate similar elements.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

In the following description, reference is made to the accompanying drawings, which illustrate several embodiments of the present invention. It is understood that other embodiments may be utilized, and mechanical compositional, structural, electrical, and operational changes may be made without departing from the spirit and scope of the present disclosure. The following detailed description is not to be taken in a limiting sense, and the scope of the embodiments of the present invention is defined only by the claims of the issued patent.

The terminology used herein is for the purpose of describing particular embodiments only and is not intended to be limiting of the invention. Spatially relative terms, such as "beneath", "below", "lower", "above", "upper", and the like may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

As used herein, the singular forms "a", "an", and "the" are intended to include the plural forms as well, unless the context indicates otherwise. It will be further understood that the terms "comprises" and/or "comprising" specify the presence of stated features, steps, operations, elements, and/or components, but do not preclude the presence or addition of one or more other features, steps, operations, elements, components, and/or groups thereof.

Where specific dimensions are referred to, it is to be understood that these are dimensions that may vary according to tolerances customary for such dimensions in the art of printed circuit board manufacture and assembly of parts to printed circuit boards. The term "substantially" may be used to indicate a nominal condition or dimension that is subject to the normal variations of manufacturing and assembly processes.

Figure 1:
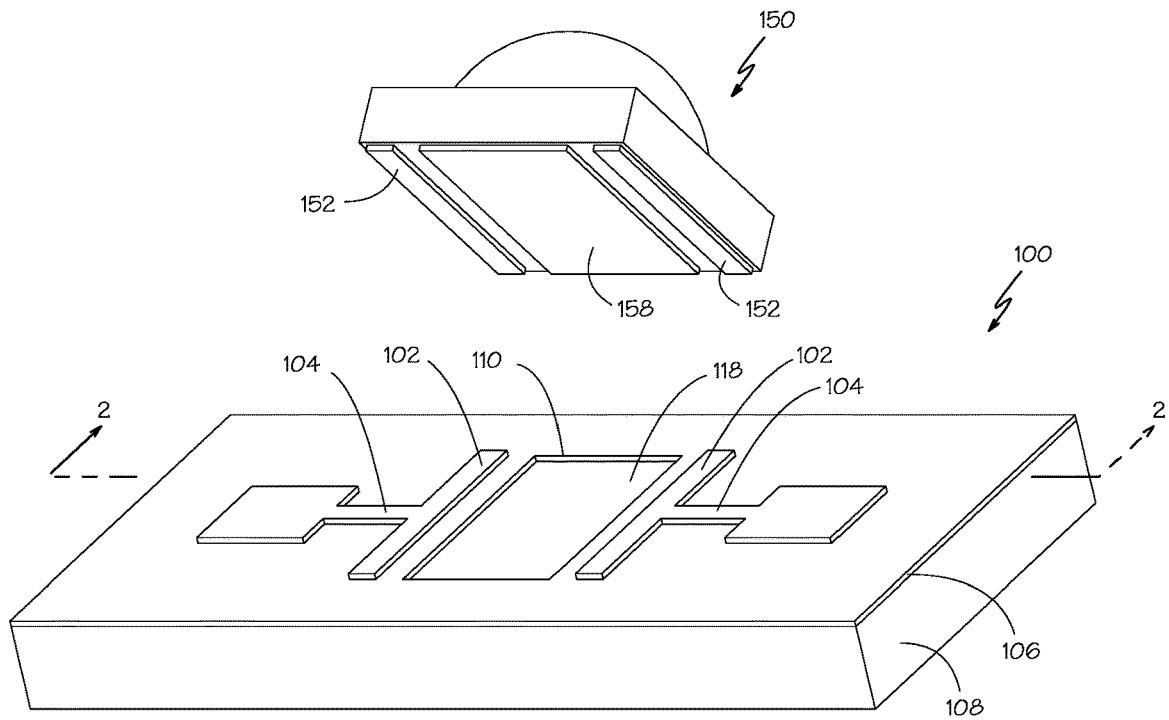
FIG. 1 is a pictorial view of an LED and a printed circuit board.

FIG. 1 is a pictorial view of an LED 150 and a printed circuit board 100. The LED 150 is shown rotated away from the printed circuit board 100 to show the terminal surfaces on the LED. The present invention provides a method of assembling a component, such as an LED (light emitting diode) 150, to a printed circuit board 100. The printed circuit board includes a circuit layer that provides circuit pads 102 corresponding to terminal surfaces 152 on the component 150. The circuit pads 102 are connected to circuit traces 104 that couple the component to an electrical circuit.

The printed circuit board further includes a thermal layer 108, which will generally be a sheet of metal or other material with a high thermal conductivity. For example, a sheet of copper or aluminum having a thickness of about 0.8 millimeters (mm) to 1.5 mm may be used as a thermal layer.

The printed circuit board 100 further includes a dielectric layer 106 having a first side coupled to the circuit layer and an opposing second side coupled to the thermal layer. The dielectric layer 106 mechanically separates and electrically isolates the circuit layer 102 from the thermal layer 108. The dielectric layer 106 may have a thickness of less than 75 micrometres (μm).

The dielectric layer 106 includes an aperture 110 that exposes a portion 118 of the thermal layer 108 corresponding to a thermal pad 158 on the component 150. The terminal surfaces 152 and the thermal pad 158 on the component 150 will generally provide substantially coplanar surfaces for assembly to the printed circuit board 100.

Figure 2:
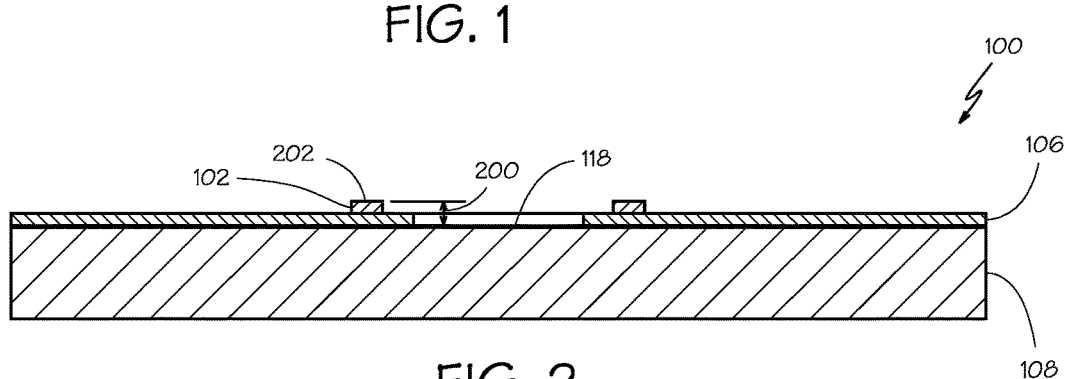
FIG. 2 is a cross-section view of the printed circuit board taken along section line 2-2 in FIG. 1.

FIG. 2 is a cross-section view of the printed circuit board taken along section line 2-2 in FIG. 1. The thicknesses of the circuit layer and the dielectric layer 106 have been exaggerated to allow the construction to be seen more clearly. A printed circuit board normally provides corresponding coplanar surfaces to be joined to the terminal surfaces and the thermal pad on the component. It will be recognized that the printed circuit board 100 used in the method of the present invention provides a surface 118 to be joined to the thermal pad 158 on the component 150 that is recessed from the surfaces 202 of the circuit pads 102 to be joined to the terminal surfaces 152 on the component 150. For example, a perpendicular distance 200 between the surface 118 of the thermal layer 108 to be joined to the thermal pad 158 on the component 150 and a side 202 of the circuit layer 102 to be joined to the terminal surfaces 152 on the component 150 may be as much as 130 micrometres (μm).

Persons having ordinary skill in the art will recognize that a surface mount component with coplanar connection surfaces should be assembled to corresponding coplanar surfaces on a printed circuit board. Persons having ordinary skill in the art will further recognize that the printed circuit board used in the method of the present invention does not provide such coplanar surfaces.

Figure 3:
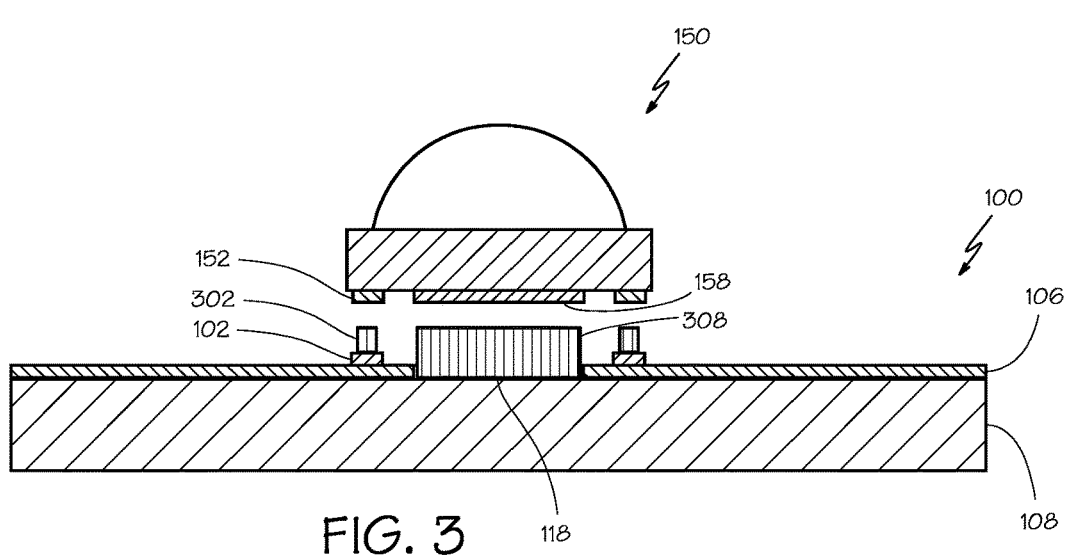
FIG. 3 is a cross-section view of the LED and the printed circuit board taken along section line 2-2 in FIG. 1.

FIG. 3 is a cross-section view of the LED and the printed circuit board taken along section line 2-2 in FIG. 1. Solder paste 302, 308 is applied to the circuit pads 102 and the portion 118 of the thermal layer 108 exposed by the aperture in the dielectric layer 106. The solder paste 302, 308 may be applied with a stencil having a thickness of between 120 and 160 micrometres (μm). The lower surfaces of the solder paste 302, 308 will be in contact with the circuit pads 102 and the thermal layer 118 and the upper surfaces of the solder paste will be substantially coplanar.

It will be appreciated that a greater volume of solder paste 302, 308 will be required on the thermal layer 108 to fill the additional volume created by the recessed thermal layer. The solder paste may be applied with a stencil having a thermal pad opening that is at least 95% of an area of the aperture that exposes the portion of the thermal layer. The stencil may have circuit pad openings with areas that are no more than 75% of areas of the corresponding circuit pads. The disparate ratios of the stencil areas to the area on the printed circuit board may allow the greater volume of solder paste 308 required on the thermal layer to be applied without overloading the circuit pads with solder paste 302.

Figure 4:
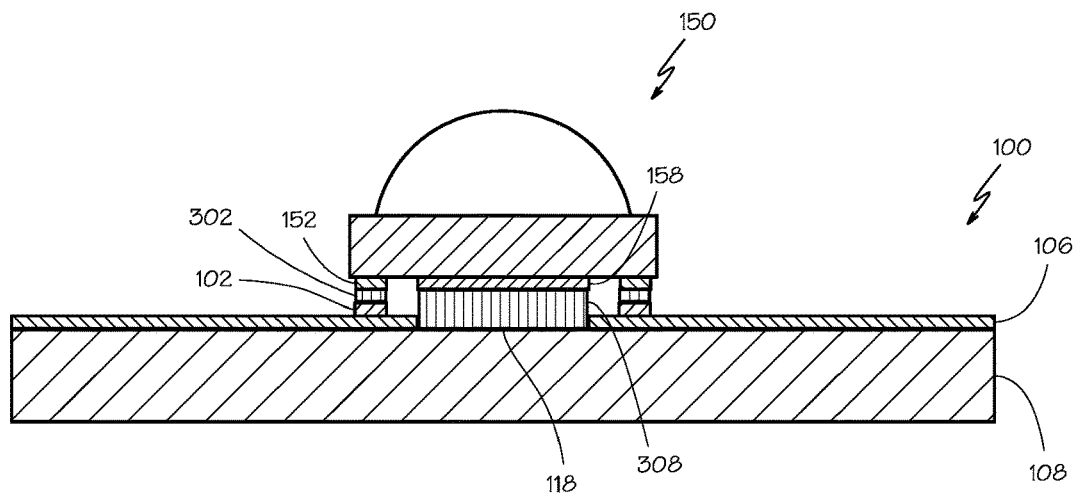
FIG. 4 is a cross-section view of the LED joined to the printed circuit board taken along section line 2-2 in FIG. 1.

FIG. 4 is a cross-section view of the LED joined to the printed circuit board taken along section line 2-2 in FIG. 1. The component 150 is placed on the solder paste 302, 308. The substantially coplanar terminal surfaces 152 and thermal pad 158 on the component 150 may be joined to the substantially coplanar upper surfaces of the solder paste 302, 308. The component 150 is placed on the solder paste 302, 308 such that the terminal surfaces 152 on the component are in contact with the solder paste 302 applied to the circuit pads 102 and the thermal pad 158 on the component is in contact with the solder paste 308 applied to the thermal layer 108. Heating the printed circuit board 100 and the component 150 then creates solder joints between the terminal surfaces 152 on the component 150 and the circuit pads 102 and between the thermal pad 158 on the component and the thermal layer 108. The solder joint provides a direct thermal path between the component 150 and the thermal layer 108. Solder will generally provide much better thermal conductivity than a dielectric material, even a dielectric material rated for low thermal resistance.

It will be appreciated that the portion 118 of the thermal layer 108 exposed by the aperture should be receptive to the soldering process. For example, the side of the thermal layer that is coupled to the dielectric layer may provide a layer of copper, which is receptive to the soldering process. A solid copper thermal layer will, of course, provide a layer of copper for the surface exposed by the aperture. A layer of copper may be bonded to a layer of aluminum to create a thermal layer that provides a layer of copper for the surface exposed by the aperture.

Figure 5:
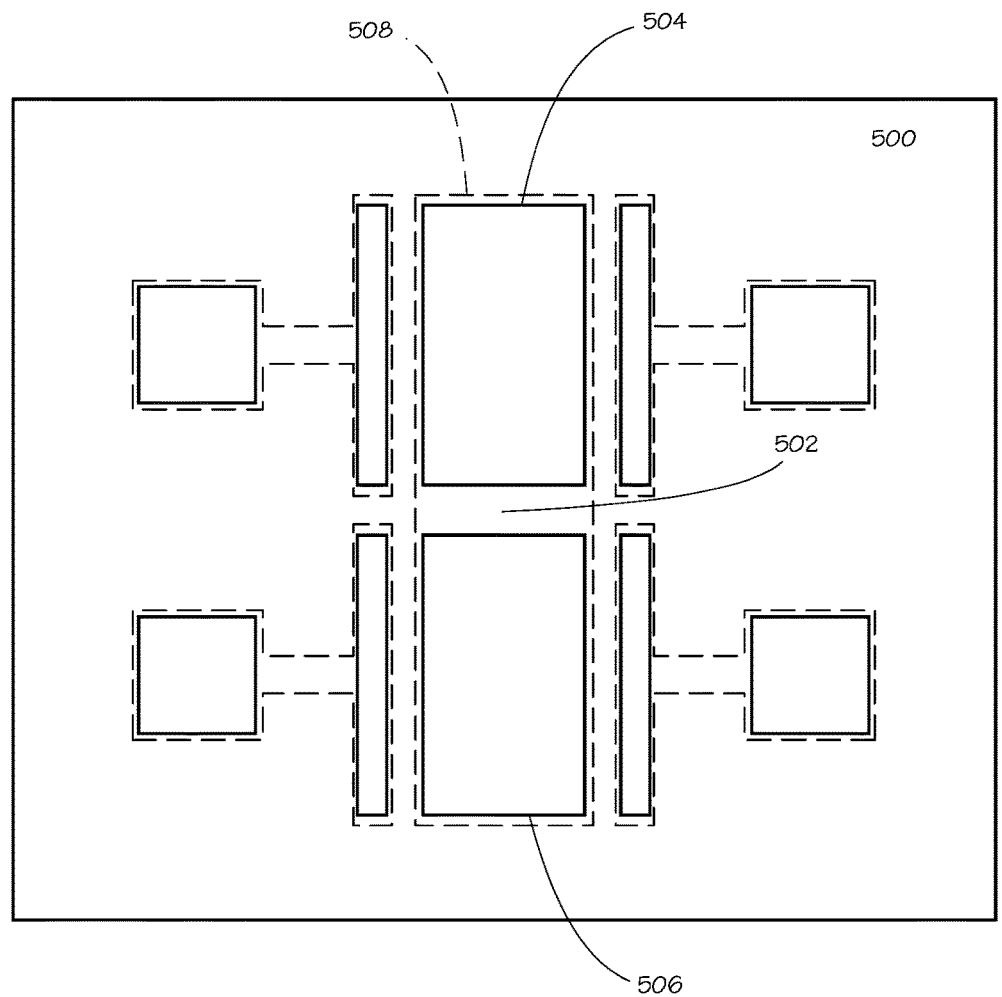
FIG. 5 is a plan view of another printed circuit board.

FIG. 5 is a plan view of another printed circuit board that can receive two components. A solder mask layer 500 may coat portions of the circuit layer and the side of the dielectric layer that faces the circuit layer. A solder mask layer may also be used on printed circuit board that can receive a single component.

If two component positions are close together, such as the two component positions shown in FIG. 5, it may be advantageous to extend the solder mask layer that coats portions of the circuit layer and the dielectric layer to cover portions 502 of the thermal layer exposed by the aperture 508. The solder mask layer 502 coats the exposed portion of the thermal layer to create a plurality of small apertures 504, 506 that expose portions of the thermal layer through the solder mask 500. This may allow the thermal pads of the components to the placed closer together than may be possible if the dielectric layer separates the exposed portions of the thermal layer for the adjacent components.

Although the foregoing embodiments have been described and shown in the accompanying drawings as typical, it would be understood that additional variations, substitutions and modifications can be made to the system, as disclosed, without departing from the scope of the invention. This invention is not limited to the specific constructions and arrangements shown and described, since various other modifications may occur to those of ordinary skill in the art. The description is thus to be regarded as illustrative instead of limiting. Accordingly, the scope of the invention should be determined not by the embodiments illustrated, but by the appended claims and their equivalents.

What is claimed is:

1. A method of assembling a surface mount component to a printed circuit board, the method comprising:
   providing the printed circuit board that includes
      a circuit layer including circuit pads that correspond to terminal surfaces on the surface mount component;
      a thermal layer that provides a thermal surface to be joined to a thermal pad on the surface mount component, the thermal surface being recessed from the circuit pads, a first side of the thermal layer being a layer of copper with a layer of aluminum coupled to the layer of copper on a second side of the layer of copper opposite the first side of the layer of copper;
      a dielectric layer having a first side coupled to the circuit layer and an opposing second side coupled to the thermal layer, the dielectric layer including an aperture that exposes a portion of the copper layer of the thermal layer, and
      a solder mask layer that coats portions of the circuit layer, the first side of the dielectric layer, and part of the exposed portion of the copper layer of the thermal layer, the solder mask layer having a small aperture therein corresponding to the thermal pad on the surface mount component;
   applying a solder paste to the circuit pads and the portion of the thermal layer exposed by the small aperture in the solder mask;
   placing the surface mount component on the solder paste; and
   heating the printed circuit board and the surface mount component to create solder joints.

2. The method of claim 1, wherein lower surfaces of the solder paste are in contact with the circuit pads and the thermal layer and upper surfaces of the solder paste are substantially coplanar.

3. The method of claim 1, wherein the solder joints are between the terminal surfaces on the surface mount component and the circuit pads and between the thermal pad on the surface mount component and the thermal layer.

4. The method of claim 1, wherein the surface mount component is placed on the solder paste such that the terminal surfaces on the surface mount component are in contact with the solder paste, as applied to the circuit pads, and the thermal pad on the surface mount component is in contact with the solder paste, as applied to the portion of thermal layer exposed by the small aperture in the solder mask.

5. The method of claim 1, wherein the dielectric layer has a thickness of less than 75 micrometres ($\mu$m).

6. The method of claim 1, wherein the solder paste is applied with a stencil having a thickness of between 120 and 160 micrometres ($\mu$m).

7. The method of claim 1, wherein the solder paste is applied with a stencil having a thermal pad opening that is at least 95% of an area of the aperture in the dielectric layer that exposes the portion of the thermal layer.

8. The method of claim 7, wherein the stencil has circuit pad openings with areas that are no more than 75% of areas of the corresponding circuit pads.

9. The method of claim 1, wherein a perpendicular distance between the second side of the dielectric layer and a side of the circuit layer furthest from the dielectric layer is less than 130 micrometres ($\mu$m).

10. The method of claim 1, wherein the terminal surfaces and the thermal pad on the surface mount component provide substantially coplanar surfaces that are placed on the solder paste.

11. The method of claim 1, wherein the surface mount component is an LED (light emitting diode).

12. A printed circuit board comprising:
   a circuit layer including circuit pads that correspond to terminal surfaces on a surface mount component;
   a thermal layer that provides a thermal surface to be joined to a thermal pad the surface mount component, the thermal surface being recessed from the circuit pads, a first side of the thermal layer being a layer of copper with a layer of aluminum coupled to the layer of copper on a second side of the layer of copper opposite the first side of the layer of copper;
   a dielectric layer having a first side coupled to the circuit layer and an opposing second side coupled to copper layer of the thermal layer, the dielectric layer including an aperture that exposes a portion of the copper layer; and
   a solder mask layer that coats portions of the circuit layer, the first side of the dielectric layer and an exposed portion of the copper layer to create a small aperture that exposes a portion of the copper layer in the dielectric layer aperture, the small aperture corresponding to the thermal pad on the surface mount component.

13. The printed circuit board of claim 12, wherein the dielectric layer has a thickness of less than 75 micrometres ($\mu$m).

14. An LED (light emitting diode) assembly comprising:
   a surface mount LED component having one or more terminal surfaces and a thermal pad;
   a printed circuit board that includes
      a circuit layer including circuit pads that correspond to the terminal surfaces on the surface mount LED component,
      a thermal layer having a layer of copper and a layer of aluminum coupled to the layer of copper that provides a thermal surface to be joined to the thermal pad on the surface mount LED component, the thermal surface being recessed from the circuit pads;
      a dielectric layer having a first side coupled to the circuit layer and an opposing second side coupled to the copper layer, the dielectric layer including an aperture that exposes a portion of the copper layer; and
      a solder mask layer that coats portions of the circuit layer, the first side of the dielectric layer, and an exposed portion of the copper layer, the solder mask layer coating an exposed portion of the copper layer to create a small aperture that exposes a portion of the copper layer in the dielectric layer aperture, the small aperture corresponding to the thermal pad on the mount LED component;
   a first solder layer that directly couples the circuit pads to the terminal surfaces on the surface mount LED component; and
   a second solder layer that directly couples the thermal layer to the thermal pad on the surface mount LED component, the second solder layer being thicker than the first solder layer.

15. The LED assembly of claim 14, wherein the dielectric layer has a thickness of less than 75 micrometres (μm).

16. The LED assembly of claim 14, wherein a perpendicular distance between the second side of the dielectric layer and a side of the circuit layer furthest from the dielectric layer is less than 130 micrometres (μm).

* * * * *